(12) United States Patent
Shimizu

(10) Patent No.: US 6,841,771 B2
(45) Date of Patent: Jan. 11, 2005

(54) OPTICAL COUPLING DEVICE AND LIGHT-RECEIVING CIRCUIT OF SAME

(75) Inventor: Takayuki Shimizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 125 days.

(21) Appl. No.: 10/134,435

(22) Filed: Apr. 30, 2002

(65) Prior Publication Data

US 2002/0175272 A1 Nov. 28, 2002

(30) Foreign Application Priority Data

May 22, 2001 (JP) ........................................ 2001-153082

(51) Int. Cl.[7] .............................. H01J 40/14; H03F 3/08
(52) U.S. Cl. ............................. 250/214 A; 250/214 AG; 330/110; 330/308; 315/151
(58) Field of Search ................... 330/110, 279, 330/308; 315/151; 250/214 A, 214 AG, 214 C, 551

(56) References Cited

U.S. PATENT DOCUMENTS 3,978,343 A * 8/1976 Broderick et al. .......... 250/551
5,812,030 A * 9/1998 Inami et al. ................. 330/308
5,828,178 A * 10/1998 York et al. ................... 315/151
5,952,883 A * 9/1999 Masuta ....................... 330/279
6,201,235 B1 * 3/2001 Takeuchi et al. ...... 250/214 AG
6,246,284 B1 * 6/2001 Nemoto ...................... 330/110

FOREIGN PATENT DOCUMENTS

| JP | 7-105524 | 11/1995 |
| JP | 2531070 | 6/1996 |
| JP | 2689967 | 8/1997 |
| JP | 2770810 | 4/1998 |

* cited by examiner

Primary Examiner—Stephone B. Allen
(74) Attorney, Agent, or Firm—Harness Dickey

(57) ABSTRACT

A light-receiving circuit of an optical coupling device may include a dummy photodiode arranged in a vicinity of a photodiode. The dummy photodiode and photodiode may convert received optical signals to photoelectric current. Amplified photoelectric current outputs from current-to-voltage converting amplifiers may be compared and subjected to waveform shaping by a hysterisis comparator for improving a common mode rejection ratio. Negative feedback paths and/or circuits of the converting amplifiers may include impedance variable circuits. The impedance variable circuits may reduce impedance based on the level of the input photoelectric current.

22 Claims, 10 Drawing Sheets

100ns

OPTICAL COUPLING DEVICE AND LIGHT-RECEIVING CIRCUIT OF SAME

BACKGROUND OF THE INVENTION

1. Field of the Invention

The present invention relates, in general to an optical coupling device and a light-receiving circuit of the same.

2. Description of the Related Art

FIG. 6 is a cross-sectional view of an arrangement for a conventional photocoupler 1. The photocoupler 1 converts an electric signal, which is inputted from a terminal 2 on a primary side, into an optical signal by a light emitting integrated circuit 3 on the primary side, converts the optical signal back into an electric signal by a light-receiving integrated circuit 4 on a secondary side, and outputs the electric signal from a terminal 5 on the secondary side. This electrically isolates a circuit on the primary side from a circuit on the secondary side, thereby realizing sending and receiving of a signal while the devices are electrically insulated from each other. A light emitting element, such as a light emitting diode, on the light emitting integrated circuit 3 and a light-receiving element, such as a photodiode, on the light-receiving integrated circuit 4 are placed in a vicinity to face each other. A gap between the elements is filled with translucent epoxy resin 6 having a given dielectric constant. Further, their outside is sealed with epoxy resin 7 having light blocking effect.

FIG. 7 is a block diagram showing an electrical arrangement for a conventional photocoupler 11. The circuit on the primary side is composed of a sending driver IC 12 and a light emitting element 13, whereas the circuit on the secondary side is composed of a receiving IC 14. In the sending driver IC 12, an amplifier 15 converts a voltage signal, which is inputted to an input terminal IN, into a current signal, and a drive element 16 drives the light emitting element 13 to turn on by using the current signal, where a voltage between terminals Vcc 1 and GND 1 is a power supply voltage. Further, the circuit on the primary side may be composed of only a light emitting element for converting the inputted electronic signal into the optical signal.

In the receiving IC 14, a light-receiving element 17 converts the optical signal into a current signal, where a voltage between terminals Vcc 2 and GND 2 is a power supply voltage. The signal is then converted from current to voltage (hereinafter referred to as I/V conversion) by a current-to-voltage converting amplifier (hereinafter referred to as an I/V converting amplifier) 18, and is subjected to waveform shaping by a comparator 19, and outputted to an output terminal OUT.

Here, a pulse width distortion characteristic is a characteristic for characterizing a photocoupler. Recent FA (Factory Automation) devices may especially have higher performance, for example, and because a semiconductor has higher performance, digital devices are now more widely used. This requires a photocoupler to have a substantially high speed, which insulates between units of an AC servo or a programmable controller for the purpose of reducing noises, and protecting the devices. For example, a photocoupler with a transmission speed of 25 Mbps may have no more than ±6 nsec of the pulse width distortion when the pulse width is 40 nsec.

On the other hand, due to unevenness in a quantity of light outputted by the light emitting element 13, manufacturing unevenness (unevenness caused during a manufacturing process) in distance between the sending-side circuit and the receiving-side circuit caused at a process of molding with the epoxy resins 6 and 7, and the like, a quantity of incoming light into the light-receiving element 17 is substantially changed. Furthermore, there is unevenness in a gain of the I/V converting amplifier 18 caused by manufacturing unevenness of the receiving-side circuit. For realizing a photocoupler having high-speed performance, it is desired that distortion of output pulse width be reduced, which is caused by quantity changes of incoming light into the light-receiving element 17.

Moreover, another characteristic characterizing a photocoupler is a common mode rejection (CMR) ratio. The CMR characteristics indicate how difficult it is to operate by disturbance noise. As shown in FIG. 6, the photocoupler 1 has a condenser structure, in which the epoxy resin 6 having a given dielectric constant is provided between the integrated circuits 3 and 4, that the integrated circuits 3 and 4 are connected by a parasitic capacitor thereof. Accordingly, when the input side and the output 5 side of the photocoupler 1 receive substantially steep noise in which a rising and a falling of the pulse may be represented by the derivative (dv/dt), and a noise current of C.(dv/dt) flows between the input side and the output side, where the parasitic capacitor is C. The noise current may cause the faulty operation, if a part of the noise current flows into the light-receiving element on the light-receiving integrated circuit 4.

One method to prevent the faulty operation covers the light-receiving element with a transparent conductive film such as an ITO film, and its potential is grounded to a GND potential on the receiving side. In such an arrangement, the noise current caused by the parasitic capacitor flows into a GND on the output side via the transparent conductive film, and the light-receiving element receives only the optical signal of the input side. This prevents the faulty operation due to noise, and thus realizing high CMR characteristics. However, this causes a problem that the process becomes complicated because it requires a specialized processing device for forming the conductive film.

Another method to prevent the faulty operation caused by the parasitic capacitor is an arrangement to employ a dummy photodiode, as disclosed in Japanese Patent No. 2531070 (publication date: Sep. 4, 1996), for example. FIG. 8 is a block diagram showing a light-receiving circuit 21 of another conventional art using such a dummy photodiode. The light-receiving circuit 21 is provided with two photodiodes d1 and d2 having identical properties in an identical shape and quantity. Only the photodiode d1 is used for receiving the optical signal from the light emitting element, whereas the other photodiode d2 is shielded from light to be used as a dummy photodiode. The dummy photodiode (12, having its light-receiving face covered with a cathode metal wiring 22, is shielded from light with a cathode potential.

The photodiode d1 and the photodiode d2 are positioned in a cross manner having a checker-board like arrangement, as shown in FIG. 9. In addition, the photodiodes d1 and d2 have an area of approximately 0.1×0.1 mm, which is sufficiently small, whereas frames on which the integrated circuits 3 and 4 are mounted have a size of, for example, 2×2 mm. This makes the noise currents flown into the photodiodes d1 and d2 substantially identical.

Therefore, output currents from the photodiodes d1 and d2 are subjected to the I/V conversion respectively by the I/V converting amplifiers a1 and a2, and compared with each other by a hysteresis comparator 23, which is a differential amplifier, and thus the output from the photodiode d1 is subjected to waveform shaping into a pulse signal. This eliminates a common mode noise component, thereby realizing the output of high CMR characteristics.

However, the I/V converting amplifiers a1 and a2 are amplifiers for linear amplification subjected to negative feedback by resistors r1 and r2 as well as condensers c1 and c2. Therefore, for reducing the distortion of the output pulse width caused by the quantity changes of incoming light, it is desired that a first stage of the amplifier have CL sufficiently wide band. However, there is a problem that the CMR characteristics deteriorate, when the band of the amplifier is wide.

Namely, the photocoupler of high speed and high CMR having the transmission speed of 25 Mbps has an objective to achieve that CMR tolerance is 10 kV/μsec and Vcm=1000V (here, the wording "CMR tolerance" means a level of CMR up to which the photocoupler can tolerate the noise in the common mode noise signal). In this case, as shown in FIG. 10(a), where a rise time of a noise pulse is 100 nsec, its pulse height value is 1 kV. As a result, a noise current waveform flown to the photodiodes d1 and d2 by coupling primary and secondary capacitors has a pulse waveform of 100 nsec, as shown in FIG. 10(b). Therefore, since the noise current waveform includes a high-frequency component of 10 MHz or more, when the band of the amplifier is widened more than a band corresponding to the 25 Mbps, the high-frequency component is easily amplified, and thus easily causing the faulty operation due to noise.

For this reason, the amplifier band cannot be used for obtaining the CMR characteristics, so the quantity of incoming light into the photodiode d1 is required to be constant for obtaining the CMR characteristics. This narrows an allowance for the manufacturing unevenness, thereby causing a problem that a photocoupler of high speed and high CMR is difficult to be manufactured with a sufficient yield.

SUMMARY OF THE INVENTION

The Exemplary embodiments of the present invention may be directed to an optical coupling device having a substantially high-speed transmission rate of a pulse. The optical coupling device may reduce pulse width distortion caused by quantity changes of incoming light directed into a light-receiving element, without being susceptible to faulty operation due to noise.

An optical coupling device may be adapted so that a circuit on a primary side of the device uses a light emitting element to convert an inputted electric signal into an optical signal. A circuit on a secondary side, in which a light-receiving element may be arranged in a vicinity of the light emitting element so as to face the light emitting element, may use the light-receiving element to convert the optical signal into an electric signal, for output as a photoelectric current. The circuit on the secondary side may include an impedance variable circuit in a negative feedback path and/or circuit of a current-to-voltage converting amplifier (an I/V converting amplifier) for amplifying the photoelectric current. The impedance variable circuit may change an impedance based on a level of the input photoelectric current. For example, the impedance variable circuit may lower a gain of the I/V converting amplifier with a rising level of the input photoelectric current.

According to an exemplary arrangement, the optical coupling device may be realized as, for example, a photocoupler, which electrically isolates the circuit on the primary side from the circuit on the secondary side by converting the input electric signal into the optical signal in the primary side circuit, and converting the optical signal back into the electric signal (photoelectric current) in the secondary side circuit. The impedance variable circuit in the negative feedback path and/or circuit of the current-to-voltage converting amplifier may amplify the photoelectric currents. For example, the impedance variable circuit may change an impedance based on a level of the input photoelectric current. The impedance variable circuit may raise the gain of the I/V converting amplifier with a lowering level of the input photoelectric currents, and may lower the gain with a rising level of the input photoelectric current. Because of this, even when outputs from the I/V converting amplifier are subjected to waveform shaping at the same threshold value, it may be possible to reduce pulse width distortion caused by the light quantity. This may realize the high-speed transmission rate of the pulse.

Moreover, in an exemplary arrangement including two sets of impedance variable circuits on the secondary side, in which the light-receiving elements may be used as a photodiode, respectively, and a dummy photodiode for the purpose of substantially eliminating a common mode noise signal, both gains of the I/V converting amplifiers (in each of the primary and secondary sides) may be reduced with respect to the common mode current due to the noise, thereby possibly restricting the faulty operation, and potentially improving the CMR characteristics.

For a fuller understanding of the exemplary embodiments of the present invention, reference should be made to the ensuing detailed description taken in conjunction with the accompanying drawings.

DETAILED DESCRIPTION OF THE EXEMPLARY EMBODIMENTS

Figure 1:
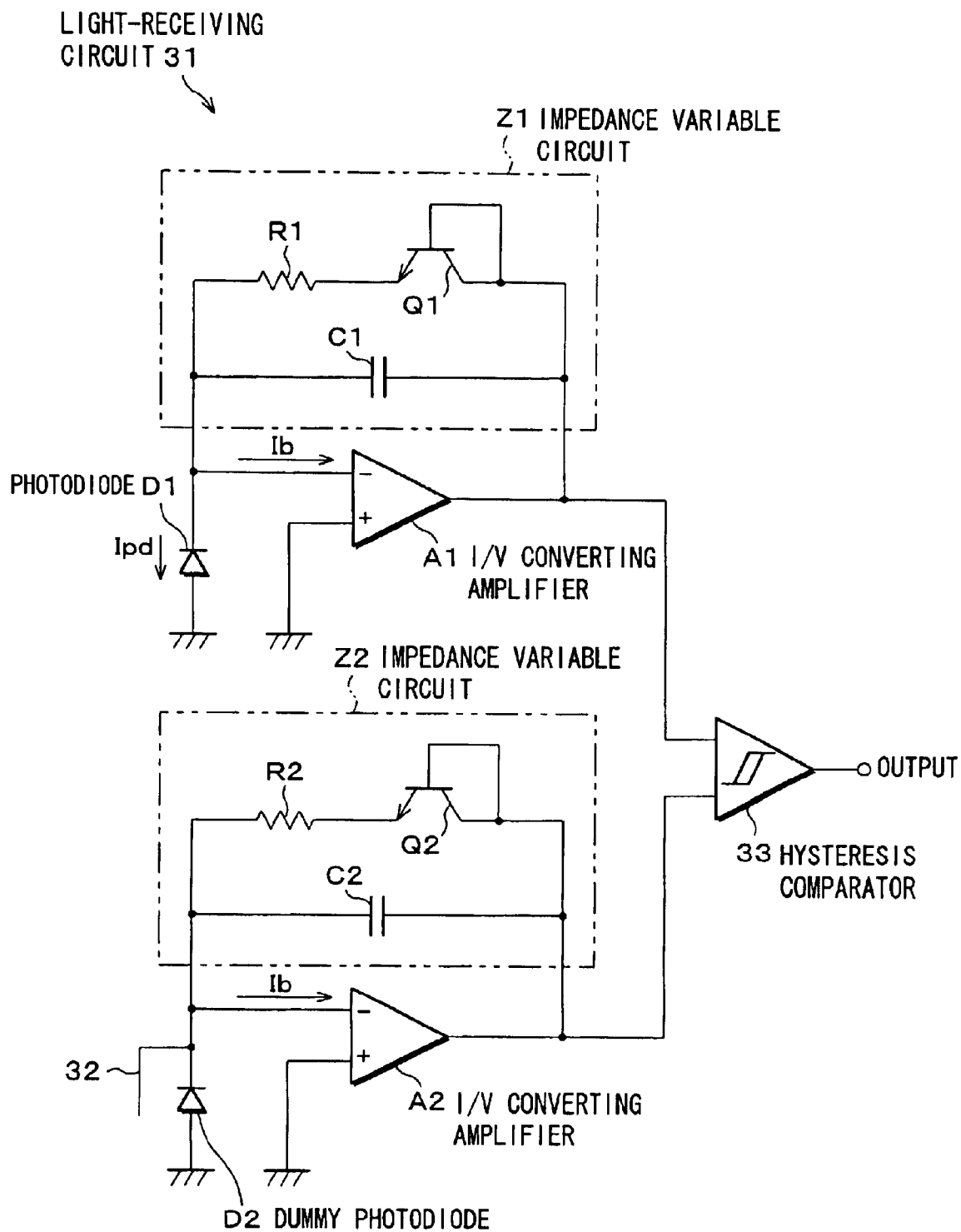
FIG. 1 is a block diagram showing an electrical arrangement of a light-receiving circuit in accordance with an exemplary embodiment of the present invention.

FIG. 1 is a block diagram showing an electrical arrangement of a light-receiving circuit 31 in accordance with an exemplary embodiment of the present invention. The light-receiving circuit 31 may be provided with two photodiodes D1 and D2 having identical properties in an identical shape and quantity, for example. Photodiode D1 may be used for receiving the optical signal from the light emitting element, whereas the photodiode D2 may be configured as a dummy photodiode, by its being shielded from light. The dummy photodiode D2 having its light-receiving face covered with a cathode metal wiring 32, is shielded from light where a cathode potential is applied on the cathode metal wiring 32.

Output currents from the photodiodes D1 and D2 may be converted into voltage respectively by the I/V converting amplifiers A1 and A2. The voltages may be compared with each other at a hysteresis comparator 33, which may be embodied as a differential amplifier, for example. In this way, the output from the photodiode D1 may be subjected to waveform shaping to generate a pulse signal. This may eliminate a common mode noise component, thereby potentially realizing an output having substantially high CMR characteristics.

The I/V converting amplifiers A1 and A2 may be embodied as amplifiers of nonlinear amplification that carry out negative feedback, respectively, via impedance variable circuits Z1 and Z2. The impedance variable circuit Z1 may include (a) a series circuit of a resistor R1 and a transistor Q1 arranged to have a diode structure (described in further detail below), and (b) a condenser C1. The series circuit and the condenser C1 may be provided in parallel between an output and a negative input of the I/V converting amplifier A1. Further, for achieving consistency an impedance variable circuit Z2 may be provided on the dummy photodiode D2 side of light-receiving circuit 31. Impedance variable circuit Z2 may include (a) a series resistor R2 and a transistor Q arranged to have a diode structure (described in further detail below), and (b) a condenser C2. The series circuit and the condenser C2 may be provided in parallel between an output and a negative input of the I/V converting amplifier A2. Here, the above arrangement may satisfy the relations R2=R1, Q2, and C2=C1, for example.

Therefore, when a current flowing through the photodiode D1 is Ipd, and a bias current of an input terminal of the I/V converting amplifier A1 is Ib, an impedance Z1 of the impedance variable circuit Z1 may be expressed as follows:

$$Z1 = R1 + (kT/q)/(Ib + Ipd), \quad (1)$$

where k is the Boltzmann constant, T is the absolute temperature, and q is an elementary electric charge.

Accordingly, since an increase of the current Ipd of the photodiode D1 decreases the impedance Z1, an input of a substantially large signal lowers a gain of the I/V converting amplifier A1. Thus, since the I/V converting amplifier A1 gives the hysteresis comparator 33 an output voltage that is subjected to logarithmic compression, it may be possible to prevent an increase in output pulse width even when the hysteresis comparator 33 carries out waveform shaping at a fixed threshold value from the I/V converting amplifier A2. Further, when a common mode current (due to noise) flows through the dummy photodiode D2 and the photodiode D1, gains of the I/V converting amplifiers A1 and A2 may be lowered. This may restrict the faulty operation, and thus may potentially realize substantially high CMR characteristics.

Moreover, when the band of the I/V converting amplifier A1 itself is wide enough, a cutoff frequency (band) fc of the I/V converting amplifier A1 may be expressed as follows:

$$fc = 1/(2\pi \cdot C1 \cdot Z1) \quad (2)$$

Accordingly, when the current Ipd of the photodiode D1 rises and the impedance Z1 is reduced as described above, the cutoff frequency fc may increase. For example, where R1=5 kΩ, C1=0.3 pF, Ib=2 μA, Ipd=1 μA, and T=300 K, Z1=13.6 kΩ and fc=39 MHz are given. Here, if the current Ipd increases to 2,A, Z1=11.45 kΩ and fc=46.3 MHz are given.

As described above, according to equation 2, the band of the I/V converting amplifier A1 may widen when, according to equation 1, the impedance Z1 is lowered, in proportion to the current Ipd of the photodiode D1. This widening in band may be possible by inserting the condenser C1 in parallel to the series circuit of the transistor Q1 and the resistor R1 that vary impedance Z1. This may further reduce pulse width distortion caused by quantity changes of incoming light. Further, this may narrow the band of the I/V converting amplifier A1 when the current Ipd of the photodiode D1 does not flow, thereby facilitating the realization of substantially high CMR characteristics.

Figure 2:
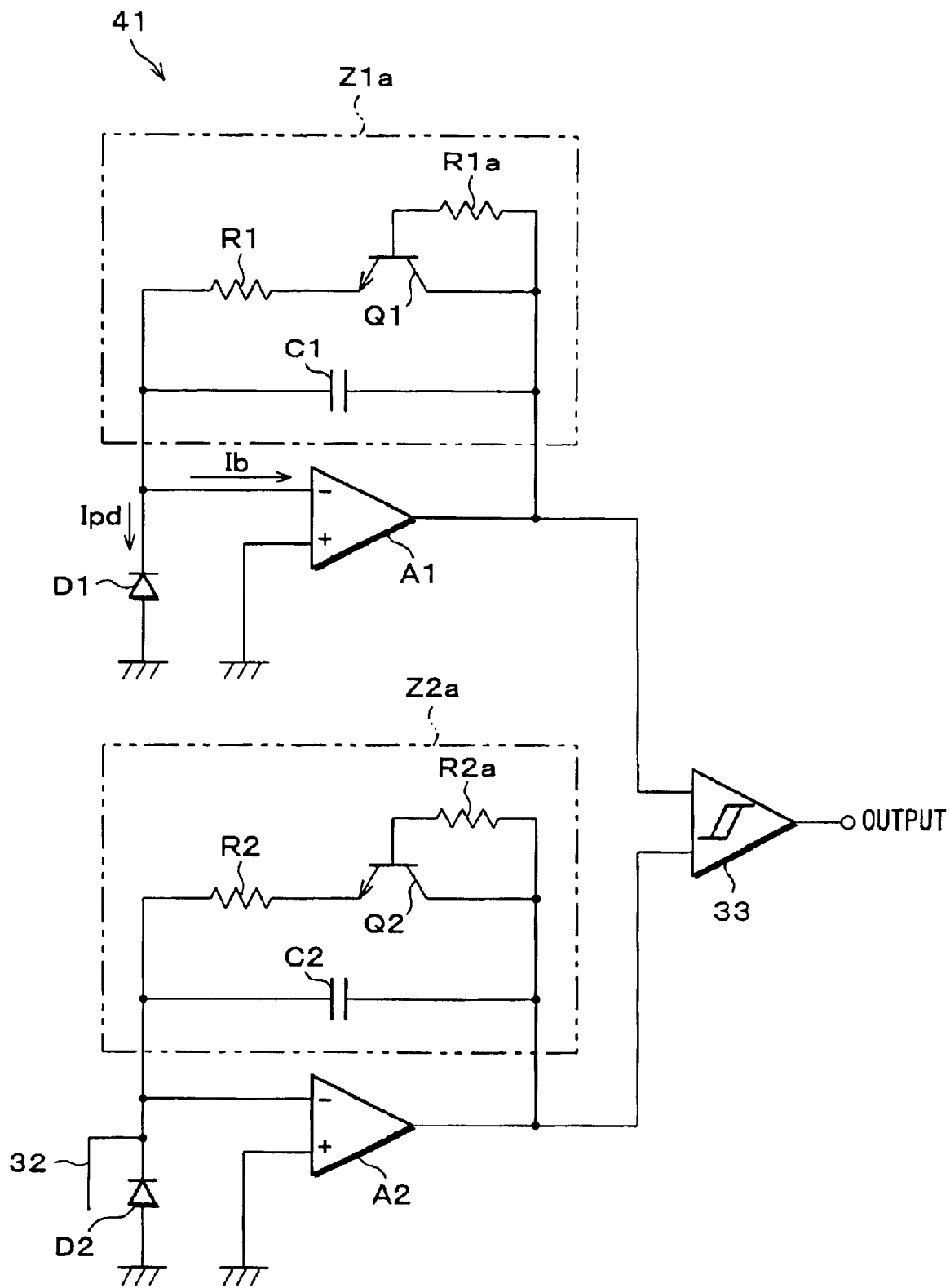
FIG. 2 is a block diagram showing an electrical arrangement of a light-receiving circuit in accordance with another exemplary embodiment of the present invention.

FIG. 2 is a block diagram showing an electrical arrangement of a light-receiving circuit 41 in accordance with another exemplary embodiment of the present invention. Since the light-receiving circuit 41 may be similar to the above-described light-receiving circuit 31, the same reference codes are assigned to the corresponding sections, and explanation thereof is omitted here.

In the light-receiving circuit 31, the transistors Q1 and Q2, which varies impedances in the impedance variable circuits Z1 and Z2, may have diode structures in which a collector and a base are connected. Meanwhile, in impedance variable circuits Z1a and Z2a in the light-receiving circuit 41, resistors R1a and R2a may be respectively provided between the collector and the base, and I/V converting amplifiers A1 and A2 may have frequency characteristics having a peak. In addition, a dummy photodiode D2 side may be arranged to satisfy R2a=R1a, as well as R2=R1 that is described above, for achieving consistency.

Therefore, equation 1 may be expressed as follows:

$$Z1 = R1 + [R1a/hFE(Q1)] + [(kT/q)/(Ib+Ipd)], \quad (3)$$

where hFE (Q1) is a current amplification ratio of the transistor Q1. The current amplification ratio hEE, having frequency characteristics, may be expressed in complex variables of equation 4 as follows;

$$hFE(jf) = hFE0/(1 + hFE0 \cdot (f/fTh) \cdot j), \quad (4)$$

where fTh is referred to as a transient frequency, which is a frequency to satisfy hFE=1.

On the other hand, an impedance of a gain which is a -value that is obtained when Z1 and C1 are connected in parallel, may have frequency characteristics expressed in equation 5 below.

$$\text{Gain resistance} = Z1//C1 = Z1/(1 + 2\pi \cdot f \cdot C1 \cdot j) \quad (5)$$

Figure 3:
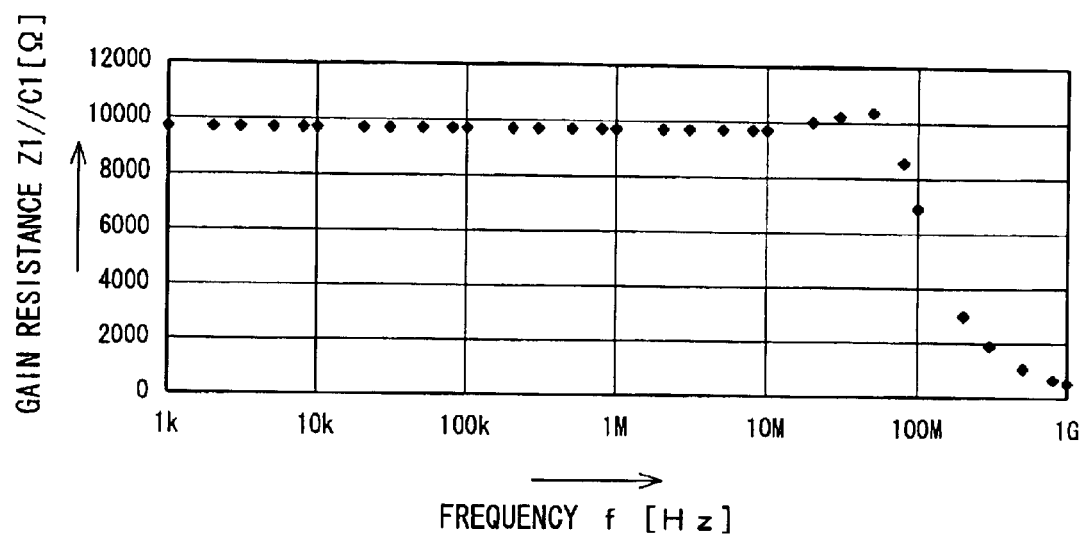
FIGS. 3(a) and 3(b) are graphs showing frequency characteristics of I/V converting amplifiers in the light-receiving circuits of FIGS. 1 and 2.
Figure 3:
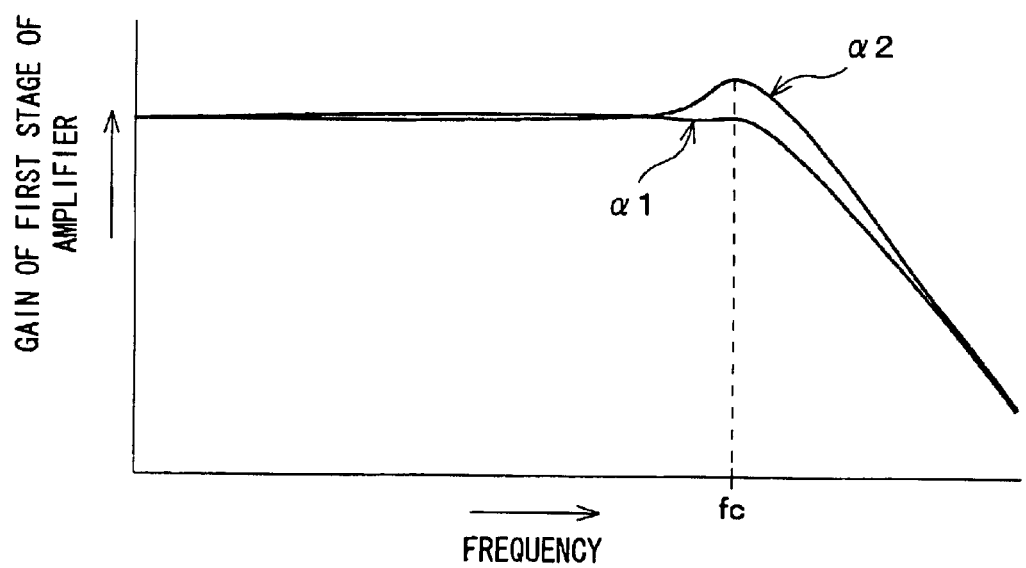

Though this calculation may be complicated, when R1=5kΩ, R1a=10kΩ, C1=0.3 pF, Ib=2 μA, Ipd=5 μA, T=300 K, hFE0=100, and fTh=1 GHz, for example, the frequency characteristics calculation of the gain resistance according to equation 5 gives a result as shown in FIG. 3(a), thus causing peaking. The peak may be eliminated if the value of resistor R1a is reduced.

The frequency characteristics of the I/V converting amplifier A1 using the impedance variable the resistance, and C1 are 18 circuit Z1 may be indicated by the reference code α1 in FIG. 3(b). Accordingly, an increase of the frequency decreases hFE (Q1) and increases the impedance Z1, if the impedance variable circuit Z1a is used. For this reason, in the frequency characteristics, according to equation 2, peaking of the gain occurs around the cutoff frequency fc, as indicated by the reference code α2. This may increase the extension rate of a band with respect to the current Ipd of the photodiode D1, thereby further reducing the pulse width distortion due to unevenness of the current Ipd.

Figure 4:
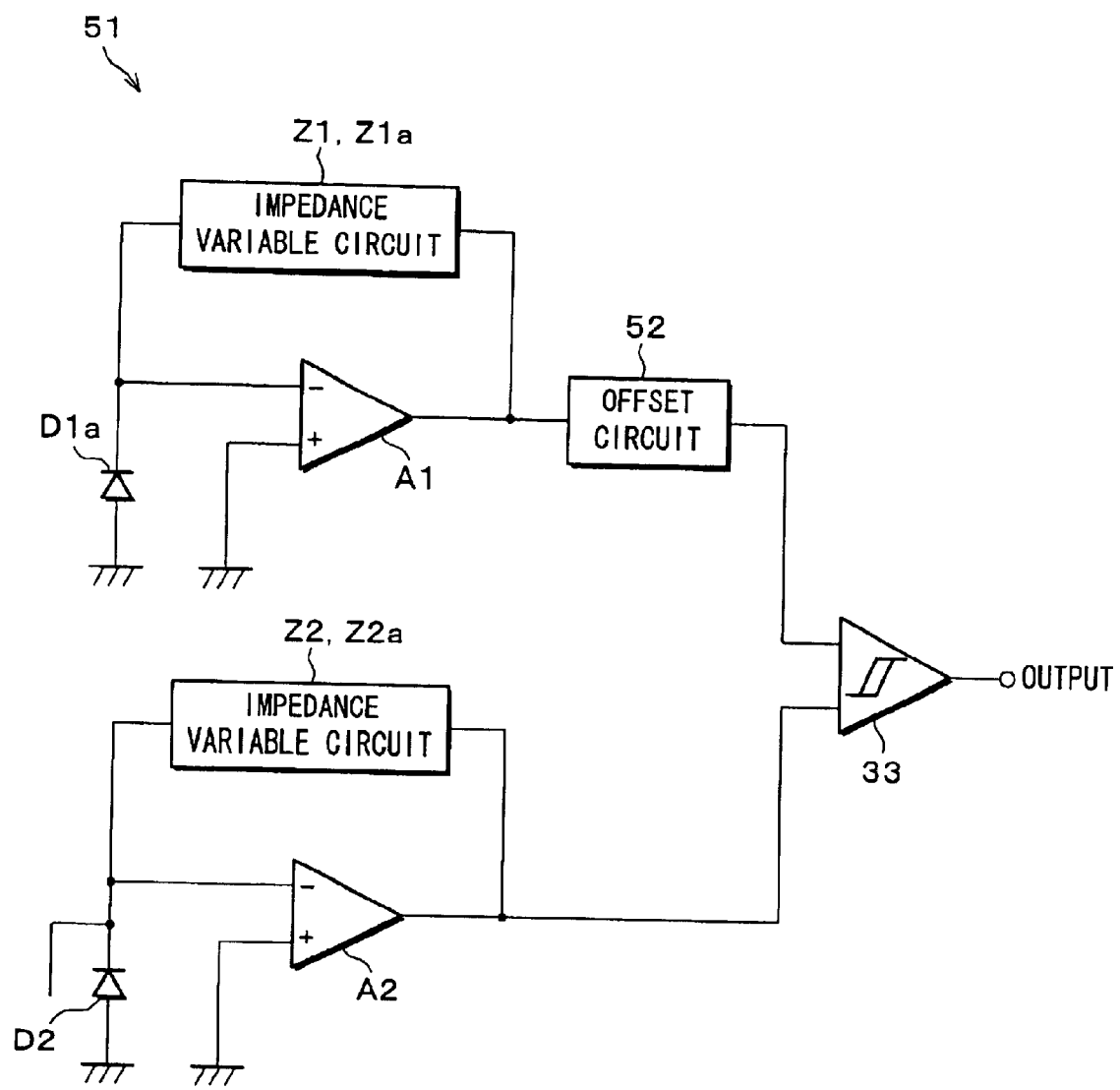
FIG. 4 is a block diagram showing an electrical arrangement of a light-receiving circuit in accordance with another exemplary embodiment of the present invention.

FIG. 4 is a block diagram showing an electrical arrangement of a light-receiving circuit 51 in accordance with another exemplary embodiment of the present invention. Since the light-receiving circuit 51 is similar to the above-mentioned light-receiving circuits 31 and 41. The same reference codes are assigned to the corresponding sections, and thus explanation thereof is omitted here. Notably, in the light-receiving circuit 51, an output terminal of the I/V converting amplifier A1 on the circuit on the photodiode D1 a side is provided with an offset circuit 52 for adjusting its sensitivity in signal reception. Therefore, because as described above, consistency is achieved between the I/V converting amplifiers A1 and A2 or the impedance variable circuits Z1 and Z2 (Z1a and Z2a), which are respectively provided in the photodiode D1 a side and the dummy photodiode lode D2 side, in this example a little inconsistency may be caused in the output terminals thereof.

Figure 5:
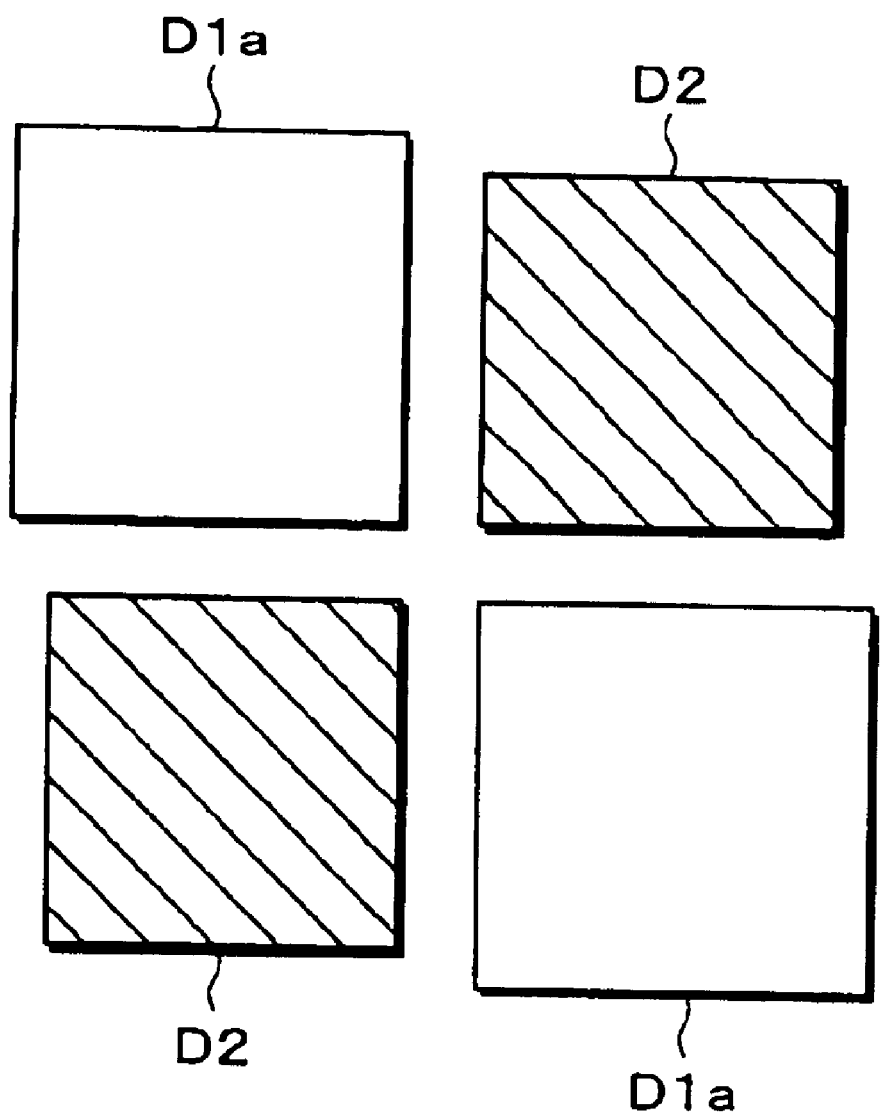
FIG. 5 is a front view showing a configuration of a photodiode and a dummy photodiode in the light-receiving circuit of FIG. 4.
Figure 6:
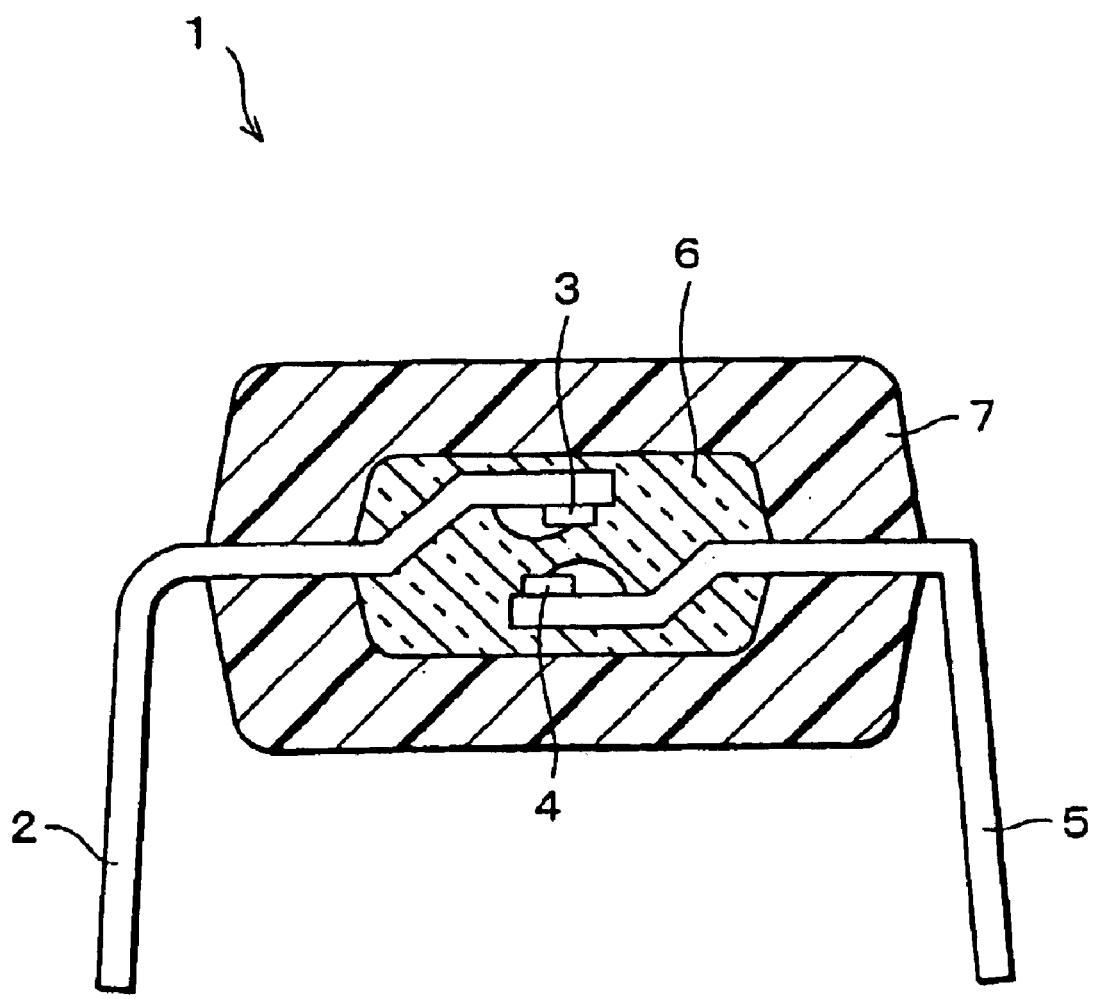
FIG. 6 is a cross-sectional view showing a structure at a conventional photocoupler.
Figure 7:
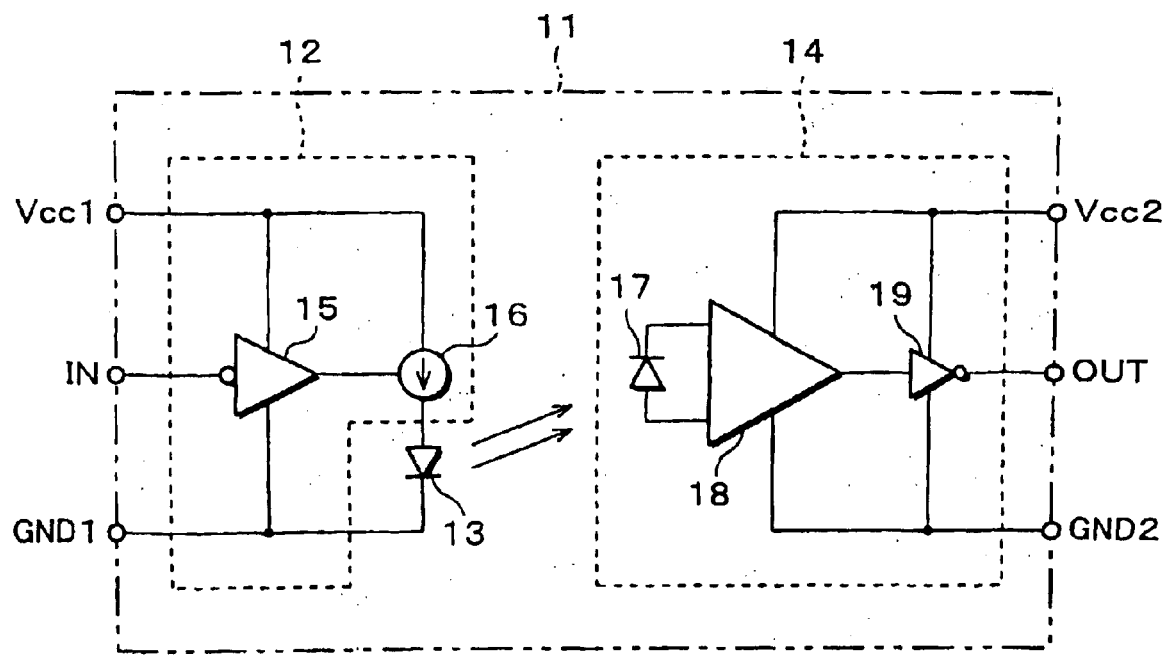
FIG. 7 is a block diagram showing an electrical arrangement of a photocoupler of a typical art.
Figure 8:
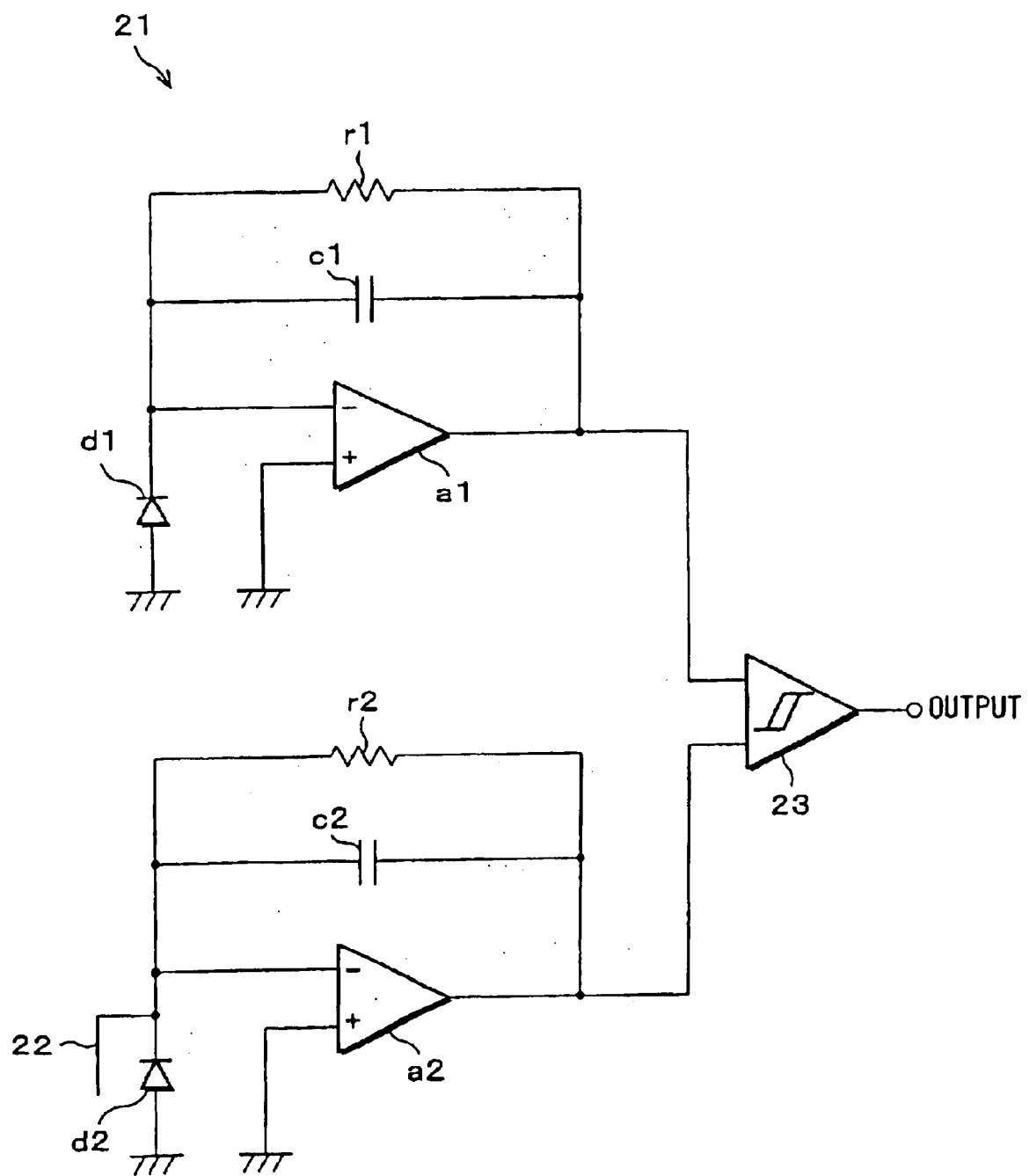
FIG. 8 is a block diagram showing of electrical arrangement of a conventional art light-receiving circuit.
Figure 9:
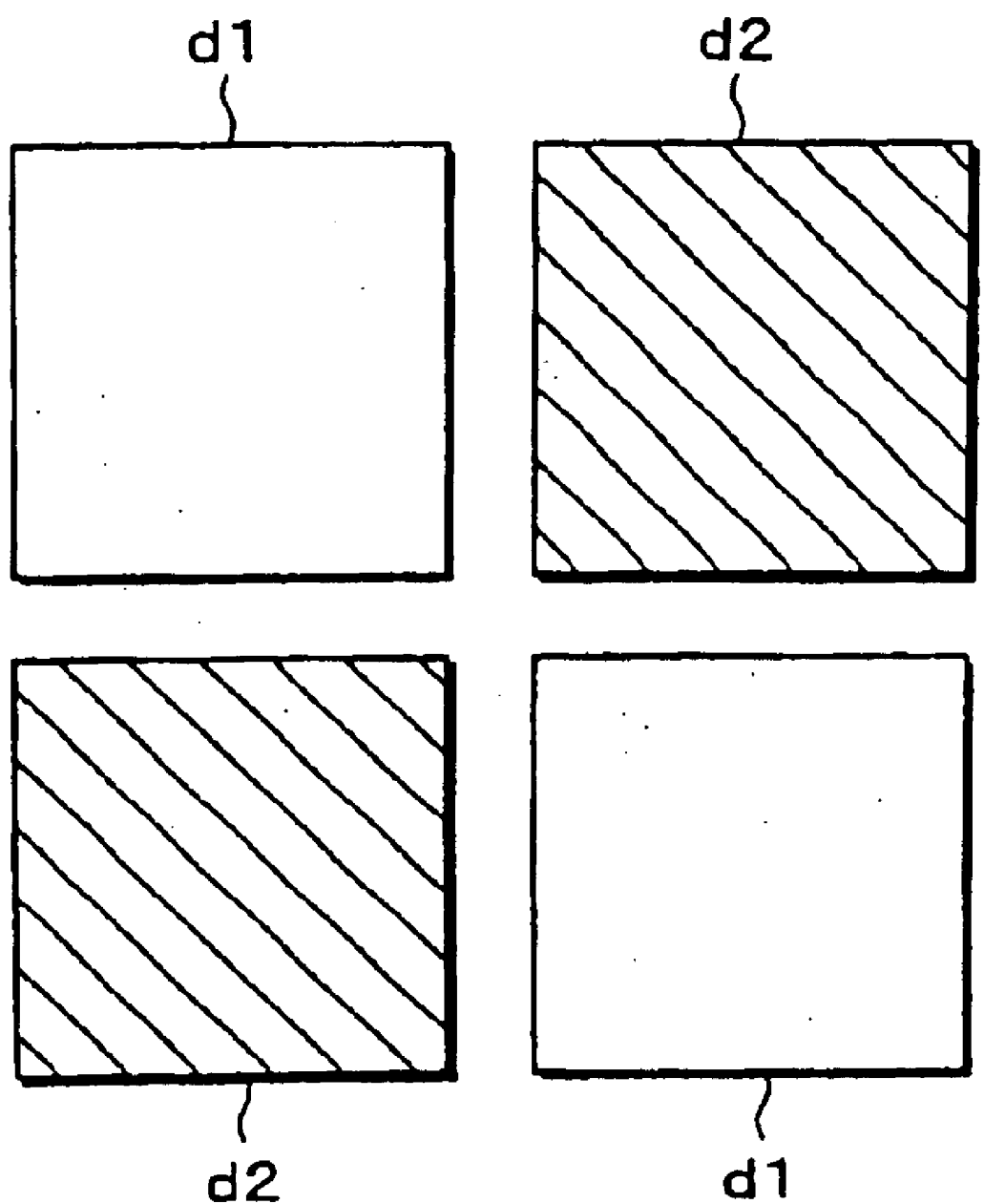
FIG. 9 is a front view showing a configuration of a photodiode and a dummy photodiode in the light-receiving circuit of FIG. 8.
Figure 10:
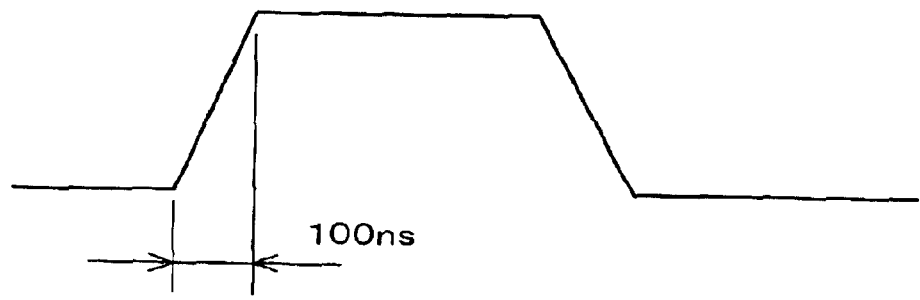
FIGS. 10(a) and 10(b) are diagrams showing noise applied to the photocoupler and an output waveform of the photodiode caused by the noise.
Figure 10:
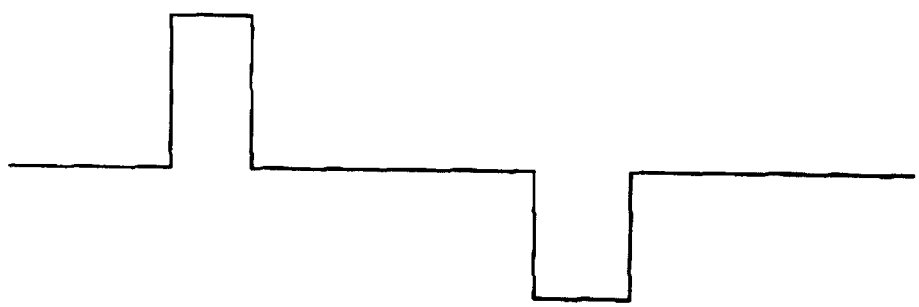

For this reason, the photodiode D1a and the dummy photodiode D2 may be formed to have different areas, respectively, as shown in FIG. 5, so as to cancel the inconsistency. This is contrary to the normal configuration, wherein D1a and D2 are formed to have an equal area, as shown in FIG. 9 for example. The area ratio may be about 1:0.9. In this way, the light-receiving circuit 51 may be configured to obtain desired CMR characteristics.

As described above, the optical coupling device in accordance with an exemplary embodiment of the present invention may be realized as, for example, a photocoupler. The optical coupling device may be so adapted to include an impedance variable circuit in a negative feedback path and/or circuit of an I/V converting amplifier for amplifying photoelectric current produced from the photo-electric conversion by the light-receiving element. The impedance variable circuit may change an impedance based on a level of the input photoelectric current. For example, the variable circuit may raise a gain of the I/V converting amplifier as the level of the input current decreases, and may lower the gain converting amplifier photoelectric when the level of the input photoelectric current increases.

Because of this, even when the outputs converting amplifier I/V converting amplifier are subjected to waveform shaping at the same threshold value, it may be possible to reduce pulse width distortion caused by the light quantity. This may realize the high-speed transmission rate of the pulse. Moreover, in an arrangement including two sets of the impedance variable circuits on the secondary sides, in which the light-receiving elements are used as a photodiode and a dummy photodiode, respectively, for the purpose of common mode noise signal, both gains of the I/V converting amplifiers may decrease with respect to current (due to the noise), thereby possibly restricting the faulty operation, and thus potentially improving the CMR characteristics.

Moreover, an optical coupling device in accordance with the exemplary embodiments of the present invention may be so adapted that a circuit on a primary side includes a light emitting element for converting an input electric signal into an optical signal, and a circuit on a secondary side that includes (a) a light-receiving element, which may be arranged in a vicinity of the light emitting element so as to face the light emitting element for receiving the optical signal. The light-receiving element may perform photoelectric conversion on the optical signal. An I/V converting amplifier may amplify the photoelectric current to output an amplified photoelectric current. The I/V converting amplifier may include a negative feedback path and/or circuit having an impedance variable circuit for lowering a gain of the I/V converting amplifier as a level of the input photoelectric current increases.

According to the exemplary arrangement, even when the outputs from the I/V converting amplifier are subjected to waveform shaping at the same threshold value, it is possible to reduce pulse width distortion caused by the light quantity. This may realize the high-speed transmission rate of the pulse. Moreover, in an arrangement including two sets of the impedance variable circuits on the secondary sides, in which the light-receiving elements are used as a photodiode and a dummy photodiode, respectively, for the purpose of eliminating a common mode noise signal, both gains of the I/V converting amplifiers may decrease with respect to the common mode current (due to the noise), thereby possibly restricting the faulty operation, and potentially improving the CMR characteristics.

Moreover, the impedance variable circuit may be alternatively composed of (a) a series circuit of a first resistor and a transistor, and (b) a condenser. The series circuit and the condenser may be provided in parallel between an output and a negative input of the I/V converting amplifier.

With this exemplary arrangement, where the condenser is inserted in parallel to the series circuit of the transistor and the first resistor to vary the impedance, the band of the I/V converting amplifier may be widened when the impedance is lowered, in proportion to the current flowing through the light-receiving element. This may further reduce pulse width distortion caused by quantity changes of incoming light. Further, this may narrow the band of the I/V converting amplifier when the current of the light-receiving element does not flow, thereby facilitating the realization of substantially high CMR characteristics.

Moreover, the impedance variable circuit may be alternatively composed of (a) a series circuit of a first resistor and a transistor, (b) a condenser, and (c) a second resistor. The series circuit and the condenser may be provided in parallel between an output and a negative input of the I/V converting amplifier, and the second resistor may be provided between a collector and a base of the transistor.

According to the exemplary embodiments of the present invention, when the frequency of the input photoelectric current increases, the current amplification ratio of the transistor in the impedance variable circuit decreases and the impedance of the impedance variable circuit increases. For this reason, in the frequency characteristics of the I/V converting amplifier, peaking of the gain may occur around the cutoff frequency. This may increase the extension rate of a band with respect to the photoelectric current, thereby further reducing the pulse width distortion caused by unevenness of the photoelectric current.

Moreover, the light-receiving element may be composed of a photodiode and a dummy photodiode, each photodiode respectively including an I/V converting amplifier connected thereto so as to eliminate a common mode noise signal. The optical coupling device may include an offset circuit at an output terminal of the I/V converting amplifier on the photodiode side for adjusting sensitivity in signal reception, wherein the photodiode and the dummy photodiode are formed to have different areas respectively so as to cancel inconsistency in outputs of the I/V converting amplifiers caused by the offset circuit.

According to the exemplary embodiments of the present invention, the common mode noise signal may be reduced and/or eliminated by providing the dummy photodiode to the photodiode and obtaining a difference between outputs of the I/V converting amplifiers which respectively correspond to the photodiode and the dummy photodiode. Moreover, in an arrangement for achieving high CMR characteristics, an area ratio between the photodiode and the dummy photodiode may be adjusted so that it is possible to cancel the inconsistency in outputs caused by the offset circuit provided for adjusting the sensitivity in signal reception. Accordingly, the sensitivity in signal reception may be more easily adjusted.

An optical coupling device in accordance with the exemplary embodiments of the present invention may be adapted to include a circuit on a primary emitting element for converting an inputted electric into an optical signal, and may include a circuit on a secondary side that includes (a) a light-receiving element, arranged in a vicinity of the light emitting element to receive the optical signal. The light-receiving element may convert the optical signal to a photodiode current. The secondary side circuit may also include (b) an I/V converting amplifier for amplifying the photoelectric current wherein the circuit on the secondary side includes a photodiode and a dummy photodiode as light-receiving elements, and I/V converting amplifiers respectively corresponding to the photodiode and the dummy photodiode. The I/V converting amplifier of the secondary side circuit may include a negative feedback path and/or circuit having an impedance variable circuit for lowering a gain of the I/V converting amplifier as a level of the input photoelectric current increases.

According to the exemplary arrangement, even when the outputs from the I/V converting amplifier are subjected to waveform shaping at the same threshold value, it may be possible to reduce pulse width distortion caused by the light quantity. This may realize the high-speed transmission rate of the pulse. Moreover, in an exemplary arrangement including two sets of the impedance variable circuits on the secondary side in which the light-receiving elements are used as a photodiode and a dummy photodiode for the purpose of eliminating a common mode noise signal, both gains of the I/V converting amplifiers may decrease with respect to the common mode current due to the noise, thereby possibly restricting the faulty operation, and potentially improving the CMR characteristics.

Moreover, the impedance variable circuit may be composed of (a) a series circuit of a first resistor and a transistor, and (b) a condenser. The series circuit and the condenser may be provided in parallel between an output and a negative input of the I/V converting amplifier.

With the condenser inserted in parallel to the series circuit of the transistor and the first resistor so as to vary the impedance, the band of the I/V converting amplifier may be widened when the impedance is lowered, in proportion to the current flowing through the light-receiving element. This may further reduce pulse width distortion caused by quantity changes of incoming light. Further, this may narrow the band of the I/V converting amplifier when the current of the light-receiving element does not flow, thereby facilitating the realization of substantially high CMR characteristics.

Moreover, the impedance variable circuit may include a second resistor provided between a collector and a base of the transistor. The second resistor may increase the extension rate of the band with respect to the current of the light-receiving element, thereby further reducing the pulse width distortion caused by unevenness of the current.

Moreover, an offset circuit may be provided at an output terminal of the I/V converting amplifier on the photodiode side of the I/V converting amplifiers respectively corresponding to the photodiode and the dummy photodiode. The offset circuit may adjust sensitivity in signal reception. The photodiode and the dummy photodiode may be formed so as to have different areas respectively.

According to the exemplary embodiments of the present invention, the common mode noise signal may be reduced and/or eliminated by providing the dummy photodiode and the photodiode and obtaining a difference between outputs of the I/V converting amplifiers respectively corresponding to them. Moreover, in an exemplary arrangement for achieving high CMR characteristics, an area ratio between the photodiode and the dummy photodiode may be adjusted so that it is possible to cancel the inconsistency in outputs caused by the offset circuit provided for adjusting the sensitivity in signal reception. Accordingly, the sensitivity in signal reception can be more easily adjusted.

Moreover, in order to solve the problems, a light-receiving circuit of an optical coupling device in accordance with the exemplary embodiments of the present invention may include a light-receiving element. The light-receiving element may be arranged in a vicinity of the light emitting element, so as to face the light emitting element for converting an input electric signal into an optical signal. The light-receiving element may perform photo-electric conversion of the optical signal to output a photoelectric current. An I/V converting amplifier may amplify the photoelectric current to output an amplified photoelectric current. The I/V converting amplifier may include a negative feedback path and/or circuit having an impedance variable circuit. The impedance variable circuit may lower a gain of the I/V converting amplifier as a level of the input photoelectric current increases.

According to the exemplary arrangement, even when the outputs from the I/V converting amplifier are subjected to waveform shaping at the same threshold value, it may be possible to reduce pulse width distortion caused by the light quantity. This may realize the high-speed transmission rate of the pulse. Moreover, in an exemplary arrangement including two sets of the impedance variable circuits on the secondary side in which the light-receiving elements are used as a photodiode and a dummy photodiode for the purpose of eliminating a common mode noise signal, both gains of the I/V converting amplifiers may decrease with respect to the common mode current (due to the noise, thereby possibly restricting the faulty operation, and thus potentially improving the CMR characteristics.

Moreover a light-receiving circuit of an optical coupling device in accordance with the exemplary embodiment of the present invention may include a light-receiving element, a vicinity of a light emitting element, so as to face the light emitting element for converting an input optical signal into an electrical signal. An I/V converting amplifier for amplify the photoelectric. The photodiode and the dummy photodiode may compose the light-receiving elements, and the I/V converting amplifier may respectively corresponds to the photodiode and the dummy photodiode. The I/V converting amplifier may include a negative feedback circuit path and/or having an impedance variable circuit for lowering a gain of the I/V converting amplifier, as a level of the input photoelectric current increases.

According to the exemplary arrangement, even when the outputs from the I/V converting amplifier are subjected to the waveform shaping at the same threshold value, it may be possible to reduce pulse width distortion caused by the light quantity. This may realize the high-speed transmission rate of the pulse. Moreover, in an exemplary arrangement including two sets of impedance variable circuits on the secondary sides in which the light-receiving elements are used as a photodiode and a dummy photodiode for the purpose of eliminating a common mode noise signal, both gains of the I/V converting amplifiers may decrease with respect to the common mode current (due to the noise), thereby possibly restricting the faulty operation, and thus potentially improving the CMR characteristics.

Moreover, impedance variable circuit may include (a) a series circuit of a first resistor and a transistor, and (b) a condenser. The series circuit and the condenser may be provided in parallel between an output and a negative input of the I/V converting amplifier.

With this exemplary arrangement where the condenser is inserted in parallel to the series circuit of the transistor and the first resistor that varies the impedance, the band of the I/V converting amplifier may be widened when the impedance is lowered, in proportion to the current flowing through the light-receiving element. This may further reduce pulse width distortion caused by quantity changes of incoming light. Further, this may narrow the band of the I/V converting amplifier when the current of the light-receiving element does not flow, thereby facilitating realization of substantially high CMR characteristics.

Moreover, the impedance variable circuit may include a second resistor. The second resistor may be provided between a collector and a base of the transistor.

Use of the second resistor may increase the extension rate of the band with respect to the current of the light-receiving element, thereby further reducing the pulse width distortion caused by unevenness of the current.

Moreover, an offset circuit may be provided at an output terminal of the I/V converting amplifier on the photodiode side of the I/V converting amplifiers respectively corresponding to the photodiode and the dummy photodiode. The offset circuit may adjust sensitivity in signal reception. The photodiode and the dummy photodiode may be formed so as to have different areas respectively.

The common mode noise signal may thus be substantially eliminated by providing the dummy photodiode to the photodiode and obtaining a difference between outputs of the I/V converting amplifiers respectively corresponding to them. Moreover, in the exemplary arrangement for achieving high CMR characteristics, an area ratio between the photodiode and the dummy photodiode may be adjusted so that it is possible to cancel the inconsistency in outputs caused by the offset circuit provided for adjusting the sensitivity in signal reception. Accordingly, the sensitivity in signal reception can be easily adjusted.

The exemplary embodiments of the present invention being thus described, it will be obvious that the same way may be varied in many ways. Such variations are not to be regarded as a departure from the spirit and scope of the exemplary embodiments of the present invention, and all such modifications as would be obvious to one skilled in the art are intended to be included within the scope of the following claims.

What is claimed is:

1. An optical coupling device, comprising
a primary side circuit including a light emitting element to convert an input electric signal to an optical and signal; and
a secondary side circuit including
a light-receiving element arranged in a vicinity of the light emitting element so as to face the light emitting element, the light-receiving element accepting the optical signal to convert the optical signal into an electric signal for output, wherein the secondary side circuit includes an impedance variable circuit arranged in a negative feedback path of a current-to-voltage converting amplifier for amplifying the photoelectric current produced from photo-electric conversion by the light-receiving element to generate a voltage, the impedance variable circuit changing an impedance based on a level of the input photoelectric current, the impedance variable circuit lowering a given gain of the converting amplifier with a rising level of input photoelectric current.

2. The optical coupling device claim 1, wherein
the impedance variable circuit includes:
a series circuit including a first resistor and a transistor,
a condenser, and
a second resistor, the series circuit and the condenser being provided in parallel between an output and a negative input of the converting amplifier, and the second resistor being provided between a collector and a base of the transistor.

3. The optical coupling device of claim 1,
wherein the light-receiving element is embodied as a photodiode and a dummy photodiode, respectively, each photodiode operatively connected to a corresponding current-to-voltage converting amplifier so as to eliminate a common mode noise signal, and
the optical coupling device further comprising
an offset circuit at an output terminal of the converting amplifier corresponding to the photodiode for adjusting sensitivity in signal reception,
wherein the photodiode and the dummy photodiode are formed so as to have different areas respectively so as to cancel inconsistency in outputs of the corresponding converting amplifiers caused by the offset circuit.

4. An optical coupling device, comprising:
a primary side circuit including a light emitting element for converting an input electric signal into an optical signal; and
a secondary-side circuit including a light-receiving element, arranged in a vicinity of the light emitting element so as to face the light emitting element, the light-receiving element performing photo-electric conversion of the optical signal to generate a photoelectric current, and current-to-voltage converting amplifier for amplifying the photoelectric current to generate a voltage,
wherein the converting amplifier includes a negative feedback path including an impedance variable circuit for lowering a gain of the converting amplifier based on a rising level of the input photoelectric current.

5. The optical coupling device as of claim 4, wherein
the impedance variable circuit includes:
a series circuit including a first resistor and a transistor, and
a condenser, the series circuit and the condenser being provided in parallel between an output and a negative input of the converting amplifier.

6. An optical coupling device, comprising:
a primary side circuit including a light emitting element for converting an input electric signal into an optical signal and a current-to-voltage converting amplifier operatively connected to the light emitting element, the light emitting element embodied as a photodiode; and
a secondary side circuit including a light-receiving element arranged in a vicinity of the light emitting element so as to face the light emitting element, the light-receiving element converting the optical signal into a photoelectric current, and current-to-voltage converting amplifier for amplifying the photoelectric current to generate a voltage, wherein the secondary side circuit on the secondary side includes a dummy photodiode as the light-receiving element and, and wherein each converting amplifier includes a negative feedback path including a corresponding impedance variable circuit for lowering a gain of the corresponding converting amplifier as a level of the input photoelectric current increases.

7. The optical coupling device of claim 6, wherein each impedance variable circuit includes a series circuit including a first resistor and a transistor and a condenser, the series circuit and the condenser being provided in parallel between an output and a negative input of each converting amplifier.

8. The optical coupling device of claim 7, wherein each impedance variable circuit includes a second resistor, provided between a collector and a base of the transistor.

9. The optical coupling device of claim 6, further comprising:

an offset circuit at an output terminal of the converting amplifier corresponding to the photodiode for adjusting sensitivity in signal reception, wherein the photodiode and the dummy photodiode are formed so as to have different areas.

10. A light-receiving circuit, comprising:

a light-receiving element arranged in a vicinity of a light emitting element so as to face the light emitting element for converting an input electric signal into an optical signal, the light-receiving element receiving the optical signal and performing photo-electric conversion of the optical signal to generate a photoelectric current;

a converting amplifier for amplifying the photoelectric current to generate a voltage, the converting amplifier including a negative feedback path having with an impedance variable circuit for lowering a gain of the converting amplifier with a rising level of the input photoelectric current.

11. The light-receiving circuit of claim 10, wherein the impedance variable circuit includes a series circuit including a first resistor and a transistor and a condenser, the series circuit and the condenser being provided in parallel between an output and a negative input of the at least one converting amplifier.

12. The light-receiving circuit of claim 11, wherein the impedance variable circuit includes a second resistor provided between a collector and a base of the transistor.

13. A light-receiving circuit, comprising:

a light-receiving element arranged in a vicinity of a light emitting element so as to face the light emitting element for converting an input electric signal into an optical signal, the light-receiving element receiving the optical signal and converting the optical signal to a photoelectric current;

at least one converting amplifier for amplifying the photoelectric current to generate a voltage, wherein the light-receiving element is embodied as one of a photodiode and a dummy photodiode, and at least one converting amplifier includes a negative feedback path with an impedance variable circuit for lowering a gain of the converting amplifier with a rising-level of the input photoelectric current increases.

14. The light-receiving circuit of claim 13, including at least two converting amplifiers, a corresponding one of the two amplifiers operatively connected to the photodiode and dummy photodiode, the circuit further comprising:

an offset circuit at an output terminal of the converting amplifier connected to the photodiode for adjusting sensitivity in signal reception, wherein the photodiode and the dummy photodiode are formed so as to have different areas.

15. An optical coupling device, comprising a primary side circuit for converting an input electric signal to an optical signal; and a secondary side circuit including a light-receiving element for converting the optical signal into a photoelectric current and a converting amplifier for converting the photoelectric current to an amplified voltage, the converting amplifier including an impedance variable circuit arranged in a feedback path thereof for changing an impedance based on a level of the photoelectric current input to the converting amplifier.

16. The device of claim 15, wherein the impedance variable circuit lowers a given gain of the converting amplifier with a rising level of input photoelectric current.

17. The device of claim 15, wherein the impedance variable circuit raises a given gain of the converting amplifier with a lowering level of input photoelectric current.

18. The device of claim 15, wherein the impedance variable circuit includes:

a series circuit including a first resistor and a transistor, and a condenser, the series circuit and the condenser arranged in parallel between an output and a negative input of the converting amplifier.

19. The device of claim 18, wherein the impedance variable circuit includes a second resistor arranged between a collector and a base of the transistor in the series circuit.

20. A light-receiving circuit, comprising:

a light-receiving element arranged in a vicinity of a light emitting element so as to convert an input electric signal into an optical signal, the light-receiving element subjecting the optical signal to photo-electric conversion to generate a photoelectric current;

a converting amplifier for amplifying the photoelectric current to generate a voltage, the converting amplifier including an impedance variable circuit arranged in a feedback path thereof for changing an impedance based on a level of the photoelectric current input to the converting amplifier.

21. The circuit of claim 20, wherein the impedance variable circuit lowers a given gain of the converting amplifier with a rising level of input photoelectric current.

22. The circuit of claim 20, wherein the impedance variable circuit raises a given gain of the converting amplifier with a lowering level of input photoelectric current.

* * * * *